(12) United States Patent
Taniguchi et al.

(10) Patent No.: US 7,605,049 B2
(45) Date of Patent: Oct. 20, 2009

(54) OPTICAL SEMICONDUCTOR DEVICE AND MANUFACTURING METHOD FOR SAME

(75) Inventors: Masaki Taniguchi, Hyogo (JP); Hisatada Yasukawa, Kyoto (JP); Takaki Iwai, Osaka (JP); Ryoichi Ito, Kyoto (JP)

(73) Assignee: Panasonic Corporation, Osaka (JP)

( * ) Notice: Subject to any disclaimer, the term of this patent is extended or adjusted under 35 U.S.C. 154(b) by 417 days.

(21) Appl. No.: 11/149,258

(22) Filed: Jun. 10, 2005

(65) Prior Publication Data

US 2005/0280015 A1 Dec. 22, 2005

(30) Foreign Application Priority Data

Jun. 17, 2004 (JP) ............... P2004-179366

(51) Int. Cl.
  *H01L 21/76* (2006.01)
  *H01L 21/311* (2006.01)
  *G02B 6/36* (2006.01)
(52) U.S. Cl. .................. 438/435; 438/700; 385/94
(58) Field of Classification Search .......... 438/435, 438/700; 385/94
See application file for complete search history.

(56) References Cited

U.S. PATENT DOCUMENTS 6,551,904 B2 * 4/2003 Kawahara .......... 438/435
6,838,332 B1 * 1/2005 Sanchez et al. ........ 438/239
6,945,712 B1 * 9/2005 Conn ................ 385/94
2003/0094564 A1 * 5/2003 Verdonk et al. ........ 250/208.2
2004/0008401 A1 * 1/2004 Szczepanek et al. ..... 359/290

FOREIGN PATENT DOCUMENTS

| JP | 05-075092 | 3/1993 |
| JP | 11-274465 | 10/1999 |
| JP | 2001-345508 | 12/2001 |

* cited by examiner

*Primary Examiner*—Howard Weiss
*Assistant Examiner*—Steven H Rao
(74) *Attorney, Agent, or Firm*—McDermott Will & Emery LLP

(57) ABSTRACT

A transistor that forms an integrated circuit, a photo detector and a micromirror are mounted on the same semiconductor substrate in an optical semiconductor device of the present invention, which has an antireflection film that is formed on the photo detector, a first insulating film which is formed on the antireflection film and in which an opening is created in the state where the antireflection film is exposed, and an etching stopping film which is formed on the first insulating film and which has been left in the periphery around the opening in the first insulating film on the antireflection film and in the periphery around the portion above the micromirror.

9 Claims, 15 Drawing Sheets

OPTICAL SEMICONDUCTOR DEVICE AND MANUFACTURING METHOD FOR SAME

BACKGROUND OF THE INVENTION

1. Field of the Invention

The present invention relates to an optical semiconductor device where an integrated circuit, a photo detector and a micromirror are mounted on the same substrate, and to a manufacturing method for the same.

2. Description of the Related Art

An optical semiconductor device is a device where a photo detector and an optical element, such as a micromirror, are formed on a substrate, such as a semiconductor substrate, together with an integrated circuit made of transistors, and is used for an optical pickup part for a DVD (digital versatile disc) or a CD (compact disc). It is desired to increase the sensitivity and speed of photo detectors, in order to deal with an increase in the speed of DVDs and CDs. In the case where such an optical semiconductor device is formed, an insulating film is formed on the surf ace of the substrate, in order to protect the surfaces of the elements, or in order to protect the wires, in the same manner as in a conventional semiconductor device. In the case where a similar insulating film is formed on photo detectors formed on the same substrate, however, a problem arises, where the photoelectric conversion efficiency decreases or disperses, due to optical interference. Therefore, the formation of an antireflection film on photo detectors is carried out, in order to enhance the photoelectric conversion efficiency. An antireflection film is formed of a silicon oxide film and a silicon nitride film on photo detectors, and then, wires for transistors are formed. Furthermore, the entire surface is covered with a thick plasma silicon nitride film, which is a protective film, and portions of the plasma silicon nitride film on the photo detectors are removed. According to this method, however, the insulating film, which is, for example, an interlayer insulating film, formed on the transistors is not formed on the antireflection film in a manner where only the antireflection film exists on the photo detectors. Therefore, the antireflection film itself is sometimes etched through the etching at the time of selective removal of the plasma silicon nitride film, and it is difficult to maintain the film thickness of the antireflection film constant. In the case where the film thickness of the antireflection film disperses as described above, the reflectance increases, and the photoelectric conversion efficiency decreases. That is to say, the manufacturing method thereof has a problem where it is difficult to control the film thickness of the antireflection film.

Therefore, a method for precisely controlling the film thickness of the antireflection film by forming an etching stopping film, such as an aluminum film, that cannot be etched with a $CF_4$ based etchant on the antireflection film has been used. Meanwhile, the silicon substrate is etched with a potassium hydroxide solution when a micromirror is formed. In this case, the etching stopping film, which is an aluminum film, is disadvantageous. That is to say, aluminum films are easily corroded by alkaline or acid. Accordingly, the etching stopping film is corroded by the potassium hydroxide solution at the time of the formation of a micromirror.

Furthermore, the material of the etching stopping film may be changed to one which is not etched by alkaline or acid, in order to prevent corrosion of the etching stopping film. In this case, however, the selective ratio of the base to the antireflection film becomes smaller, making it impossible to selectively remove only the etching stopping film. Therefore, the antireflection film itself is also etched, and it becomes difficult to maintain the film thickness thereof constant.

BRIEF SUMMARY OF THE INVENTION

According to the present invention, an optical semiconductor device where an integrated circuit, a photo detector and a micromirror are mounted on the same substrate is manufactured as follows. An antireflection film is formed on a photo detector in a region where photo detectors are formed. To form an etching stopping film for the antireflection film, an insulating film is formed on the antireflection film, and the etching stopping film is formed on this insulating film. The etching stopping film is formed on the insulating film, also in a region where micromirrors are formed. An interlayer insulating film is formed on the integrated circuit, and openings are created in the interlayer insulating film in the region where photo detectors are formed, and in the region where micromirrors are formed, so as to expose the etching stopping film. At this time, the etching stopping film and the insulating film beneath it protect the antireflection film. Furthermore, a protective film is formed on the entire region. At the time when the protective film and the etching stopping film are removed through etching in the region where photo detectors are formed and in the region where micromirrors are formed, the upper portion of the antireflection film is covered with the insulating film. The quality of the material of the insulating film on the antireflection film is different from the quality of the material of the etching stopping film, and thereby, it becomes possible to remove the protective film and the etching stopping film through etching in the state where the insulating film is left on the antireflection film. That is to say, at the time of the removal of the protective film and the etching stopping film, the antireflection film is protected from being etched by the insulating film on the antireflection film. Due to this state where the insulating film is left on the antireflection film, the antireflection film is protected from the potassium hydroxide solution or the like that is used for the etching of the substrate at the time when the insulating film on the substrate and the substrate are etched so as to form a micromirror in the region where micromirrors are formed in a subsequent process. The quality of the material of the insulating film on the antireflection film may have corrosion resistance against the potassium hydroxide solution or the like for the formation of a micromirror. In this manner, the formation of a micromirror is carried out in the state where the antireflection film is protected in advance by the insulating film.

In the region where micromirrors are formed, the insulating film on the substrate is etched, and in addition, the substrate is etched, so as to form a micromirror. At the time of the formation of a micromirror by etching the substrate with a potassium hydroxide solution or the like, the insulating film is left on the antireflection film in advance, in a manner where the insulating film on the antireflection film is protected from the potassium hydroxide solution or the like, and therefore, the antireflection film is not corroded.

In addition, the etching stopping film that has been partially left is also not corroded by the potassium hydroxide solution or the like. The quality of the material of the etching stopping film may be selected in advance so as to be one that is not corroded. Here, in the case where the etching stopping film is an aluminum film, it is not necessary for the insulating film to be placed on the antireflection film. However, the etching stopping film is not an aluminum film, and therefore, the insulating film is left on the antireflection film, as described above.

After the formation of a micromirror, the insulating film on the antireflection film is removed through etching in the region where photo detectors are formed, so as to expose the antireflection film. In the case where the top of the antireflection film is covered with an etching stopping film made of an aluminum film, this etching stopping film is corroded at the time of the formation of a micromirror. In the case where the coating film that covers the antireflection film is adjusted to have the quality of a material that is strong against a potassium hydroxide solution or the like, the selective ratio of this coating film to the antireflection film becomes worse at the time of removal of the coating film from the antireflection film through etching, and thus, the film thickness of the antireflection film is disturbed at the time of removal of the coating film through etching. In order to avoid such a disadvantage, an insulating film having the quality of a material that is not corroded by a potassium hydroxide solution or the like at the time of formation of a micromirror is formed on the antireflection film, and furthermore, an etching stopping film is formed on this insulating film. This etching stopping film becomes an etching stopping film at the time of the exposure of the insulating film on the antireflection film by creating openings in the protective film above the integrated circuit in the region where photo detectors are formed.

As described above, the etching stopping film functions so as to prevent the insulating film on the antireflection film from being etched at the time of the removal of the interlayer insulating film through etching in the region where photo detectors are formed. The insulating film on the antireflection film functions so as to prevent etching of the antireflection film at the time of the removal of the substrate through etching in the region where micromirrors are formed. In addition, the insulating film on the antireflection film brings a large selective ratio of the insulating film to the antireflection film at the time of removal of this insulating film from the antireflection film, so that the film thickness of the antireflection film can be controlled with high precision. Moreover, the etching stopping film also functions so as to prevent dispersion in the forms of micromirrors and photo detectors.

As a result of the above, an optical semiconductor device according to the present invention is an optical semiconductor device where an integrated circuit, a photo detector and a micromirror are mounted on the same substrate, of which the structure has:

an antireflection film formed on the photo detector;

an insulating film formed on the antireflection film, where an opening is created in the state where the antireflection film is exposed; and an etching stopping film which is formed on the above described insulating film, and which is left around the periphery of the opening in the insulating film on the antireflection film, as well as around the periphery of the portion above the micromirror.

In the optical semiconductor device having this structure, the film thickness of the antireflection film has been controlled with precision during the manufacturing process thereof.

In the above described optical semiconductor device, it is preferable for the etching stopping film which is left around the periphery of the portion above the photo detector to be formed as a film for reflecting light that has entered into an end of the photo detector. The etching stopping film, which works as a reflection film, suppresses the effects of light in peripheral areas of the end of the photo detector, and thus, the sensitivity and the speed of response of the photo detector are increased.

In the above described optical semiconductor device, it is preferable for the antireflection film and the etching stopping film to be made of silicon nitride films, and it is preferable for the insulating film on the antireflection film to be made of a BPSG film. BPSG is glass where boron (B) and phosphorous (P) have been added into a silicon oxide film. A BPSG film has great corrosion resistance against a potassium hydroxide solution or the like at the time of the formation of a micromirror, and has a great selective ratio relative to silicon nitride films.

In addition, the above described optical semiconductor device may have a structure where a capacitor is further provided to the same substrate. In this case, it is preferable for the etching stopping film to be used also as the capacitor insulating film of the capacitor. The etching stopping film is formed simultaneously with the formation of the capacitor insulating film, and therefore, the formation of the etching stop film becomes simple.

Next, a manufacturing method for an optical semiconductor device according to the present invention is a manufacturing method for an optical semiconductor device where an integrated circuit, a photo detector and a micromirror are mounted on the same substrate, which includes:

a step of forming an antireflection film on the photo detector;

a step of forming an insulating film on the antireflection film; and a step of forming an etching stopping film on the insulating film.

The above described manufacturing method for an optical semiconductor device further includes:

a step of removing the etching stopping film through etching in such a manner as to leave the etching stopping film in a region where photo detectors are formed, and in a region where micromirrors are formed;

a step of forming an interlayer insulating film on the etching stopping film that has been left;

a step of creating a first opening in the interlayer insulating film so as to expose the etching stopping film in the region where photo detectors are formed, and in the region where micromirrors are formed;

a step of forming a first protective film on the interlayer insulating film and the etching stopping film that is exposed; and a step of creating a second opening in the first protective film and the etching stopping film within the first opening.

In the above description, the etching stopping film is left around the periphery of the second opening in the step of creating the second opening.

The above described manufacturing method for an optical semiconductor device further includes:

a step of creating a third opening in the insulating film within the second opening that has been provided in the region where micromirrors are formed;

a step of etching the substrate within the third opening so as to form the micromirror;

a step of forming a second protective film on a portion of the substrate where the micromirror has been formed;

a step of creating a fourth opening in the second protective film within the first opening that has been provided above the photo detector; and a step of etching the insulating film within the fourth opening so as to expose the antireflection film.

In the above described configuration, after the formation of the interlayer insulating film that covers wires on the substrate, only the portion of the interlayer insulating film on the photo detector is removed, so that the etching stopping film is exposed, and then, the etching stopping film and the insulating film are removed, so that it is possible to leave only the antireflection film on the photo detector.

In addition, according to the above described manufacturing method for an optical semiconductor device, it is preferable for the etching stopping film that has been provided around the periphery of the portion above the photo detector to be used as a film for reflecting light that has entered into an end of the photo detector.

In addition, according to the above described manufacturing method for an optical semiconductor device, it is preferable for the antireflection film and the etching stopping film to be formed of silicon nitride films, and it is preferable for the insulating film to be formed of a BPSG film.

In addition, according to the above described manufacturing method for an optical semiconductor device, it is preferable to form a capacitor in the same substrate in the state where the etching stopping film is also used as the capacitor insulating film.

Additional objects and advantages of the present invention will be apparent from the following detailed description of preferred embodiments thereof, which are best understood with reference to the accompanying drawings.

BRIEF DESCRIPTION OF THE DRAWINGS

In the respective diagrams, the same symbols are attached to parts that are the same.

DETAILED DESCRIPTION OF THE PREFERRED EMBODIMENTS

In the following, an optical semiconductor device and a manufacturing method for the same according to the embodiments of the present invention are described in detail, in reference to the drawings.

Figure 14:
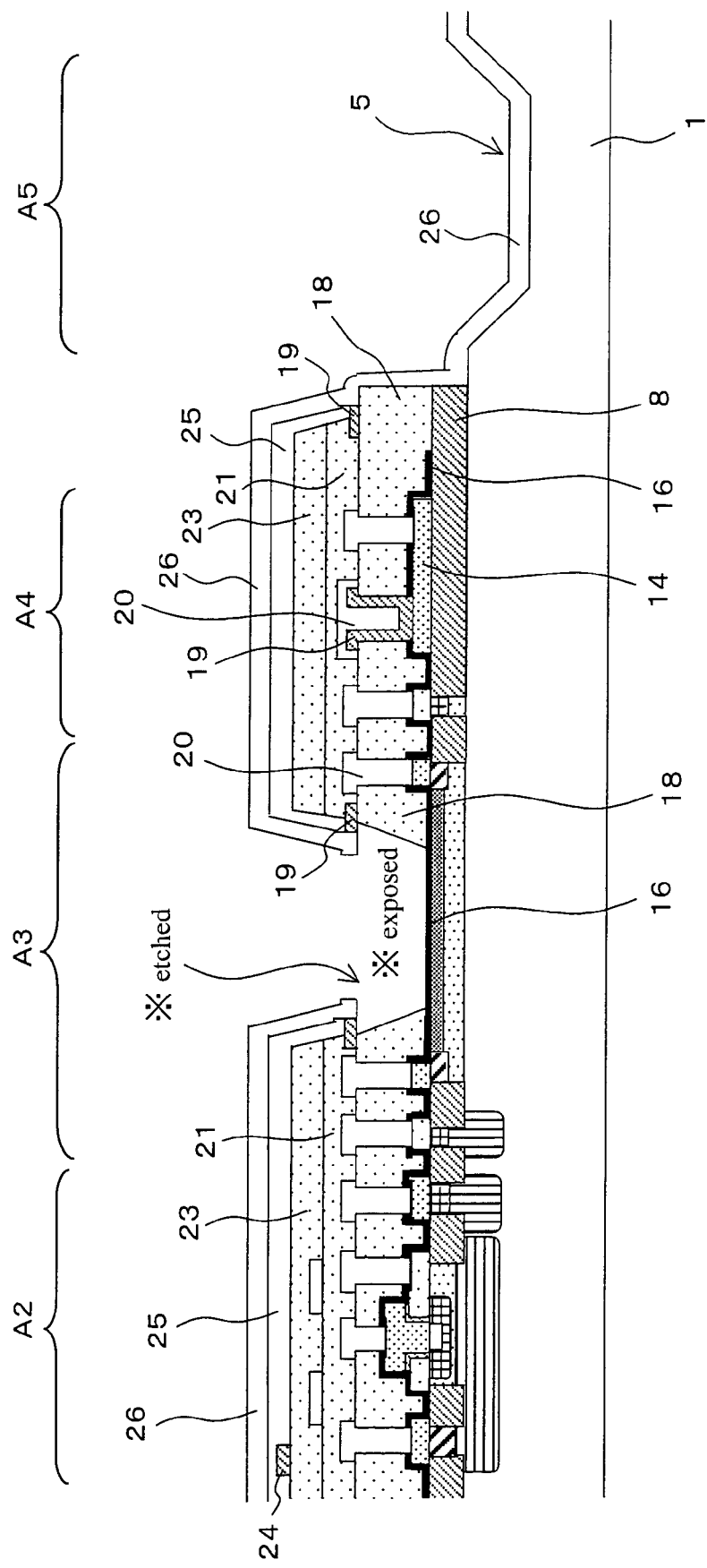
FIG. 14 is a cross sectional diagram illustrating the steps up to the exposure of the antireflection film of the photo detector in accordance with the above described manufacturing method.
Figure 15:
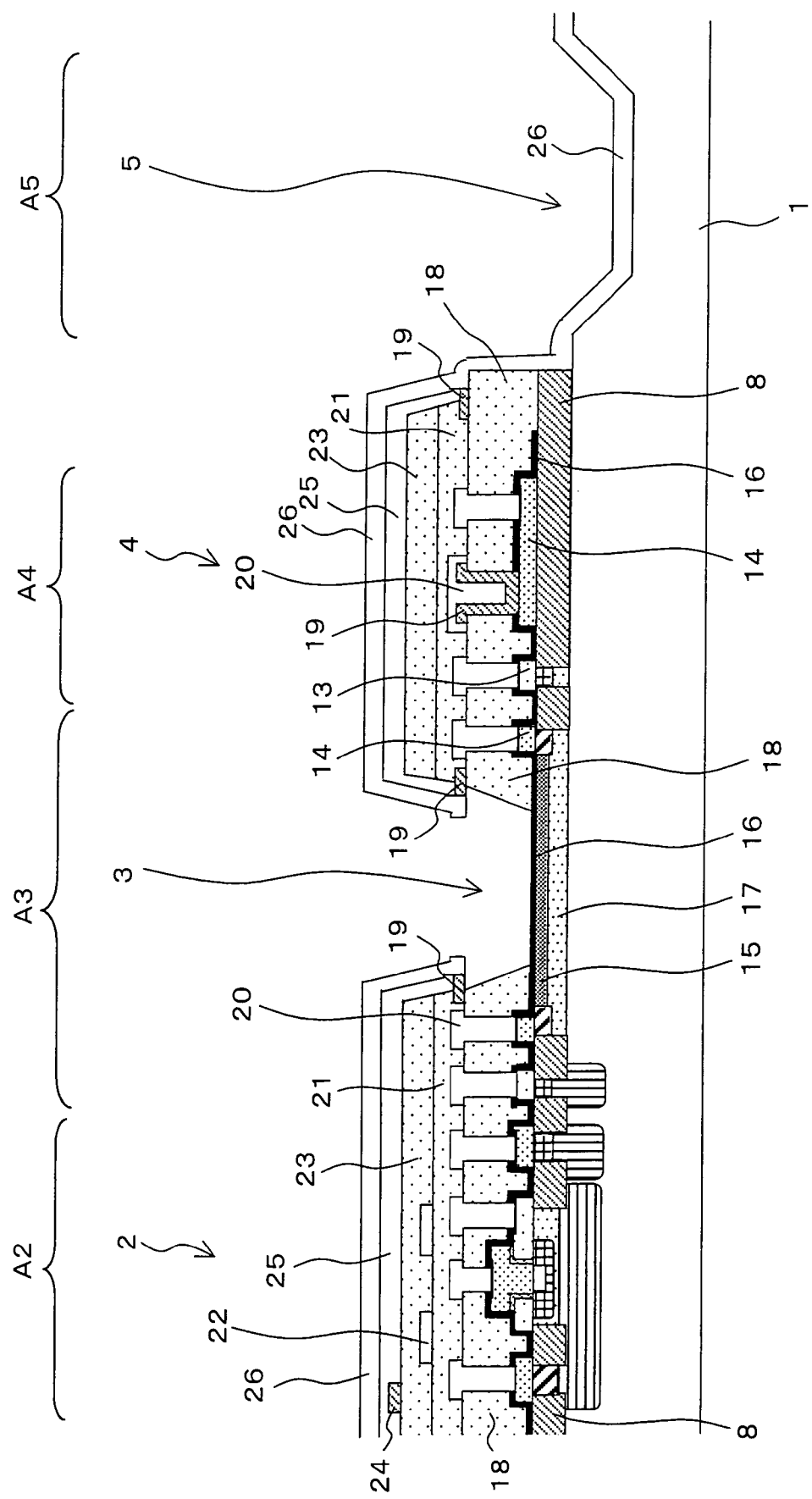
FIG. 15 is a cross sectional diagram showing an optical semiconductor device according to an embodiment of the present invention.

FIGS. 1 to 14 are cross sectional diagrams illustrating the respective steps of the manufacturing method for an optical semiconductor device according to the present invention, and FIG. 15 is a cross sectional diagram showing the completed state of the optical semiconductor device.

According to the present embodiment, as shown in FIG. 15, an etching stopping film 19, which is also used as a capacitor insulating film, is formed of a silicon nitride film above an antireflection film 16 of a photo detector 3 with an intervening first insulating film 18 in an optical semiconductor device, where a transistor 2, the photo detector 3, a capacitor 4 and a micromirror 5 are formed on a semiconductor substrate 1.

Figure 1:
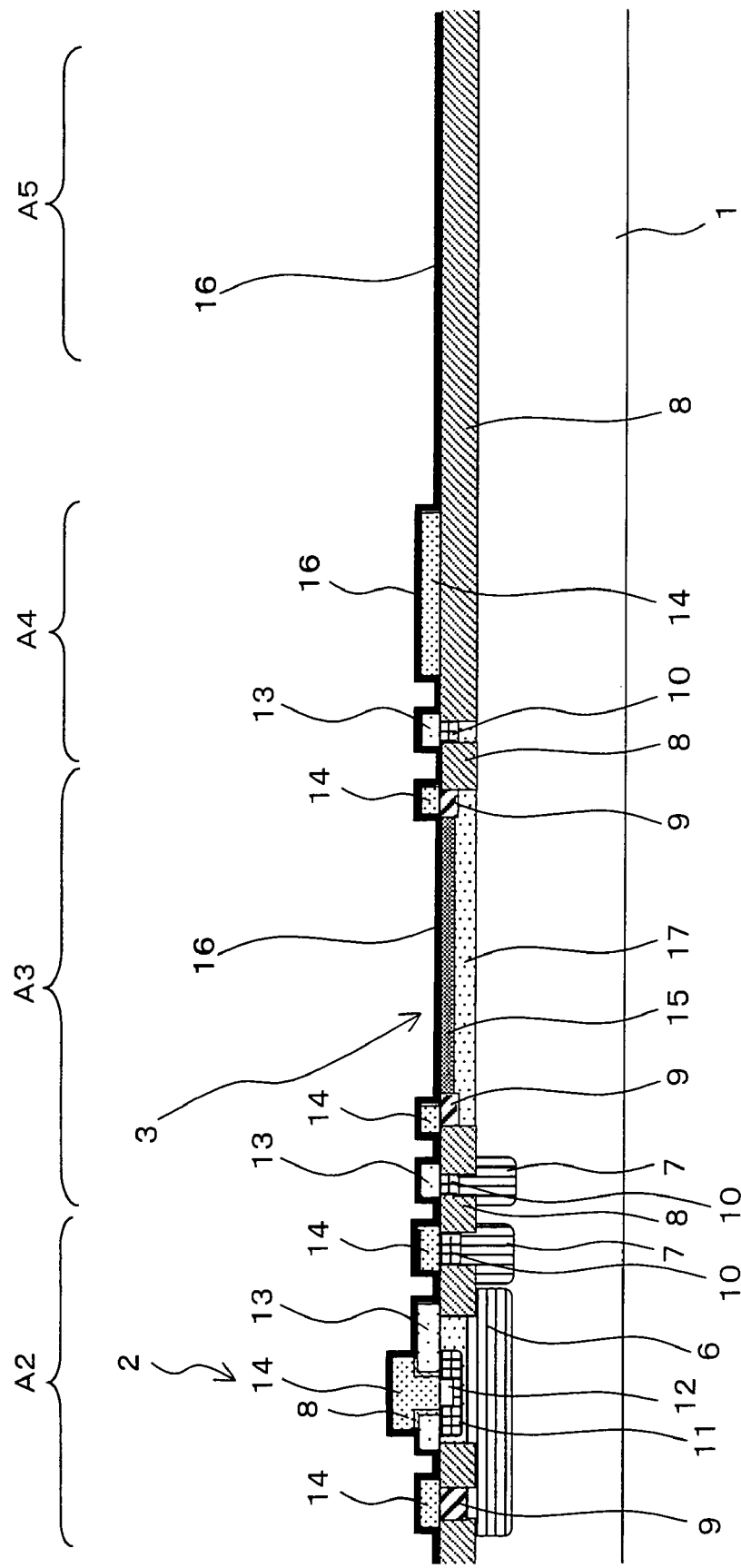
FIG. 1 is a cross sectional diagram illustrating the steps up to the formation of an antireflection film in accordance with the manufacturing method for an optical semiconductor device according to an embodiment of the present invention.

(1) First, as shown in FIG. 1, a region where transistors are formed A2, a region where photo detectors are formed A3, a region where capacitors are formed A4 and a region where micromirrors are formed A5 have been set in the semiconductor substrate 1.

The transistor 2 and the photo detector 3 are formed on the surface of the semiconductor substrate 1 using well known lithographic technology, etching technology, epitaxial technology, ion implantation technology and the like.

Though bipolar transistor is shown as the transistor 2, a field effect transistor (such as a MOS transistor) may be used in addition to this. The semiconductor substrate 1 is of a P type and N type collector regions are denoted as 6 and 9, a P type buried layer is denoted as 7, a P type base region is denoted as 11 and an N type emitter region is denoted as 12. Polysilicon electrodes 13 and 14 are formed on the respective regions. The transistor 2 forms a drive circuit for the photo detector 3 or other signal processing circuits. Photoelectric conversion is carried out on light that has entered into the surface of the photo detector 3 in this photo detecting region, so that the charge that corresponds to this incident light is outputted to the polysilicon electrodes 13 and 14 as a photoelectric current. Though a photodiode is shown as the photo detector 3, this may be a phototransistor, or other photoelectric converting elements in addition to this.

The photo detector 3 has an anode region (1, 7 and 10) and a cathode region (17, 15 and 9). The polysilicon electrodes 13 and 14 are formed on the anode and cathode regions. Here, a light emitting element, such as a laser, may be formed on the same substrate, in addition to the photo detector 3.

Insulating films for isolation that have been formed according to a LOCOS method in the region where capacitors are formed A4 and the region where micromirrors are formed A5 are denoted as 8. An insulating film for isolation 8 also exists between the elements, the transistor 2 and the photo detector 3. The polysilicon electrode 14 has been formed as a lower electrode in the region where capacitors are formed A4.

As described above, the basic configuration of the transistor 2, the basic configuration of the photo detector 3, the insulating films for isolation 8 and the polysilicon electrode 14, which is the lower electrode of the capacitor, have been formed, and after that, an antireflection film 16 is formed of a silicon nitride film on the entirety of the surface in accordance with a CVD method. This is the state shown in FIG. 1.

Figure 2:
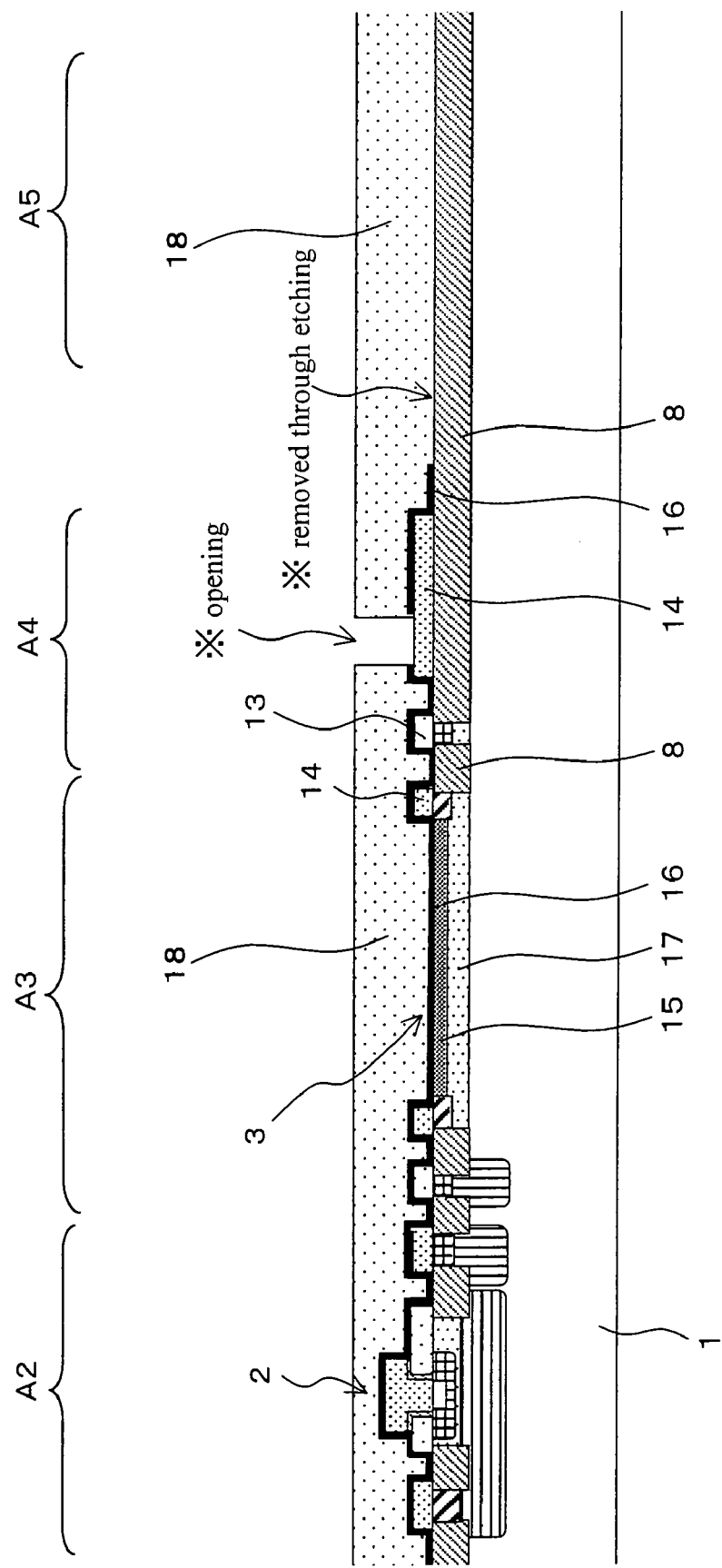
FIG. 2 is a cross sectional diagram illustrating the steps up to the creation of an opening for exposing a portion where an electrode and the insulating film of a capacitor make contact with each other in accordance with the above described manufacturing method.

(2) Next, as shown in FIG. 2, the antireflection film 16 in the region where micromirrors are formed A5 is removed according to a photo-etching technology, and a first insulating film 18 is formed of a BPSG (glass where boron (B) and phosphorous (P) have been added to a silicon oxide film) film. After that, a portion of the first insulating film 18 and the antireflection film 16 on the polysilicon electrode 14 in the region where capacitors are formed A4 is etched so as to create an opening.

Figure 3:
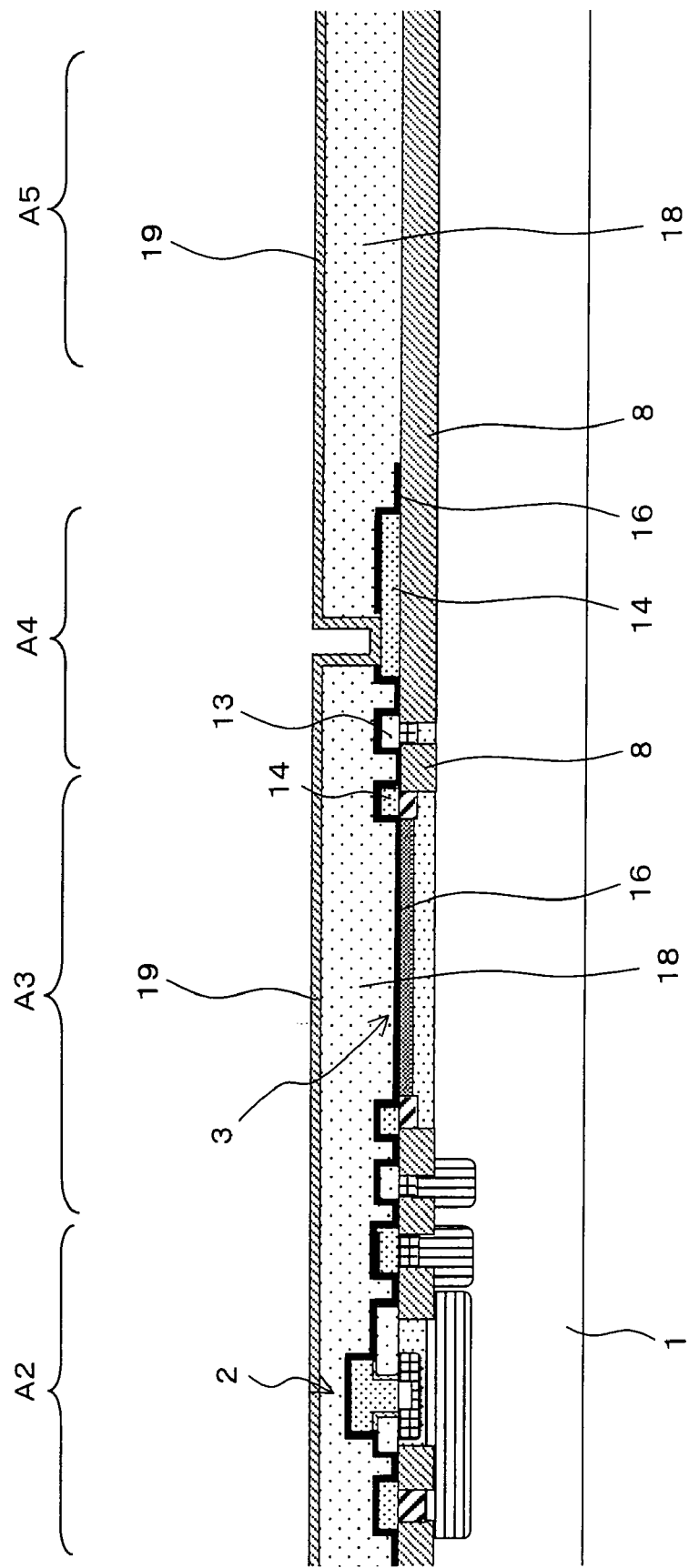
FIG. 3 is a cross sectional diagram illustrating the steps up to the formation of an etching stopping film (also used as the capacitor insulating film) in accordance with the above described manufacturing method.

(3) Next, as shown in FIG. 3, an etching stopping film 19 is formed of a silicon nitride film according to a CVD method.

Figure 4:
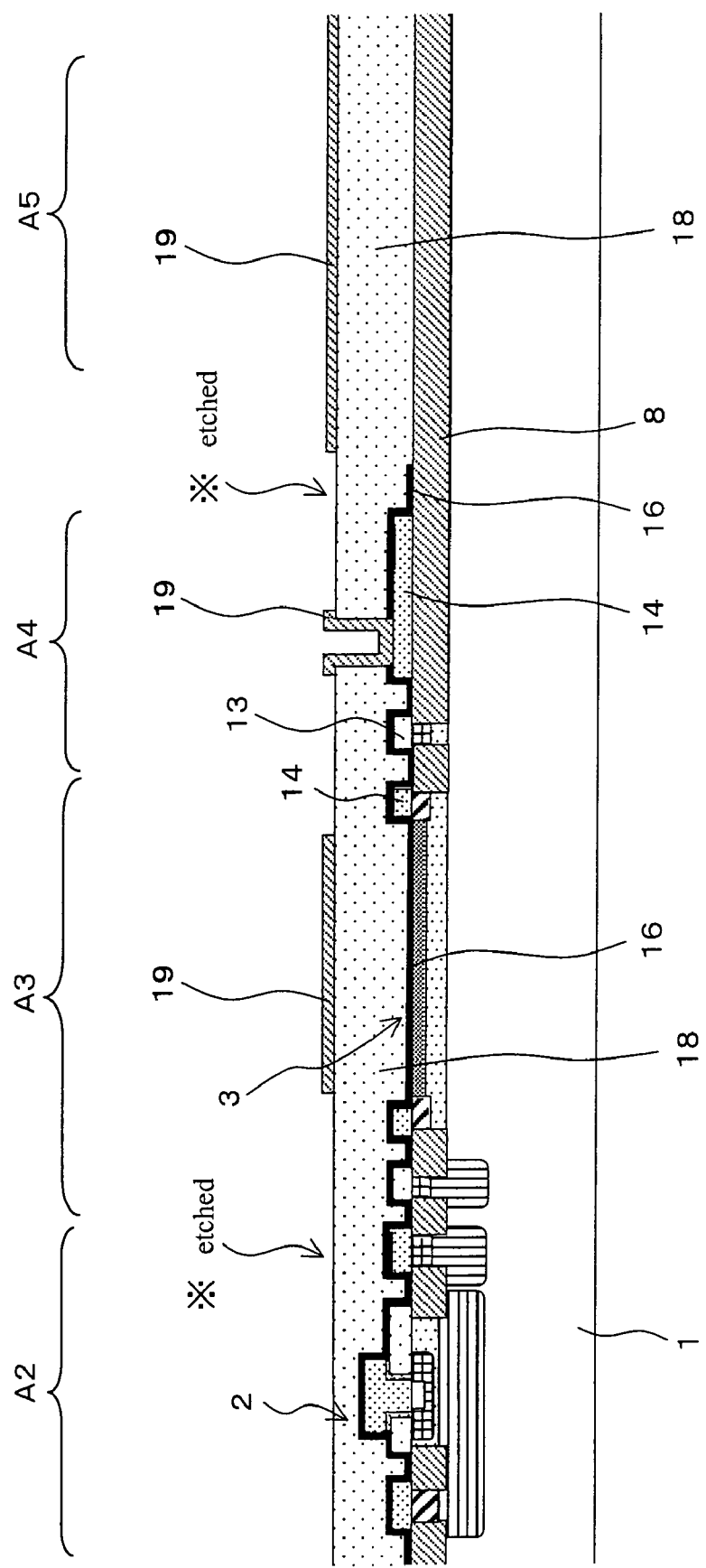
FIG. 4 is a cross sectional diagram illustrating the steps up to the creation of an opening in the capacitor insulating film outside the region where the photo detector, the capacitor and the micromirror are formed in accordance with the above described manufacturing method.

(4) Next, as shown in FIG. 4, the etching stopping film in regions other than the region where photo detectors are formed A3, the region where capacitors are formed A4 and the region where micromirrors are formed A5 is removed according to a photo etching technology, in such a manner that the etching stopping film 19 is left only in these regions. The etching stopping film 19 is left in the region where capacitors are formed A4, so that it may be used also as the capacitor insulating film in the capacitor. As described above, the etching stopping film is formed simultaneously with the formation of the capacitor insulating film, and therefore, the etching stopping film can be formed without adding any new steps.

Figure 5:
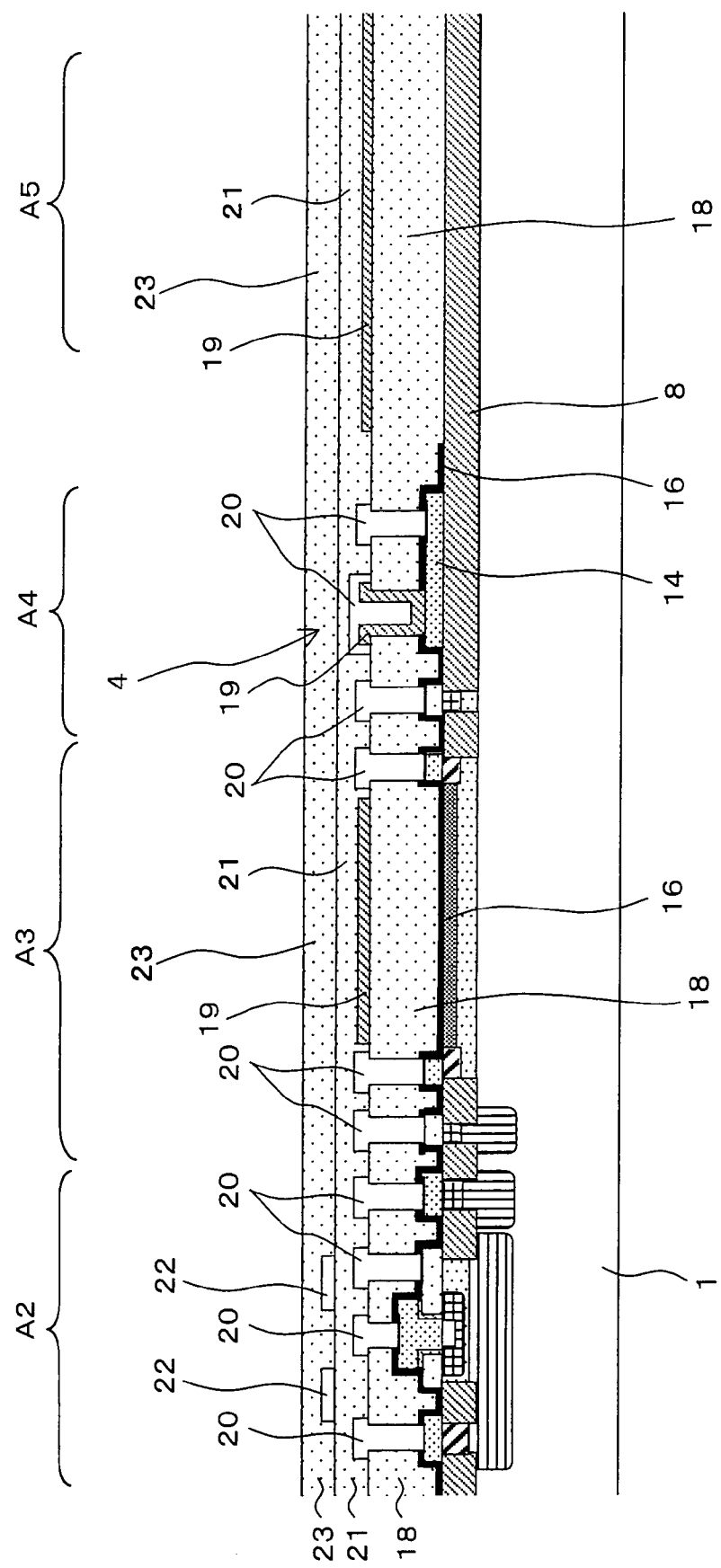
FIG. 5 is a cross sectional diagram illustrating the steps up to the formation of a third insulating film in accordance with the above described manufacturing method.

(5) Next, as shown in FIG. 5, a first wire layer 20, a second insulating film 21, a second wire layer 22 and a third insulating film 23 are formed using a PVD method, a CVD method or a photo etching technology. According to the present embodiment, aluminum films are used for the first wire layer 20 and the second wire layer 22, and plasma TEOS (tetra ethyl ortho silicate $[Si(OC_2H_5)_4]$) films are used for the second insulating film 21 and the third insulating film 23. Here, before the formation of the wire layers, the steps of creating openings in the insulating films are provided, in order to form contact regions between the electrodes and the wires, as well as between the wires. Here, though the present embodiment provides a process for wires in three layers, it may provide other processes, in addition to this process.

Figure 6:
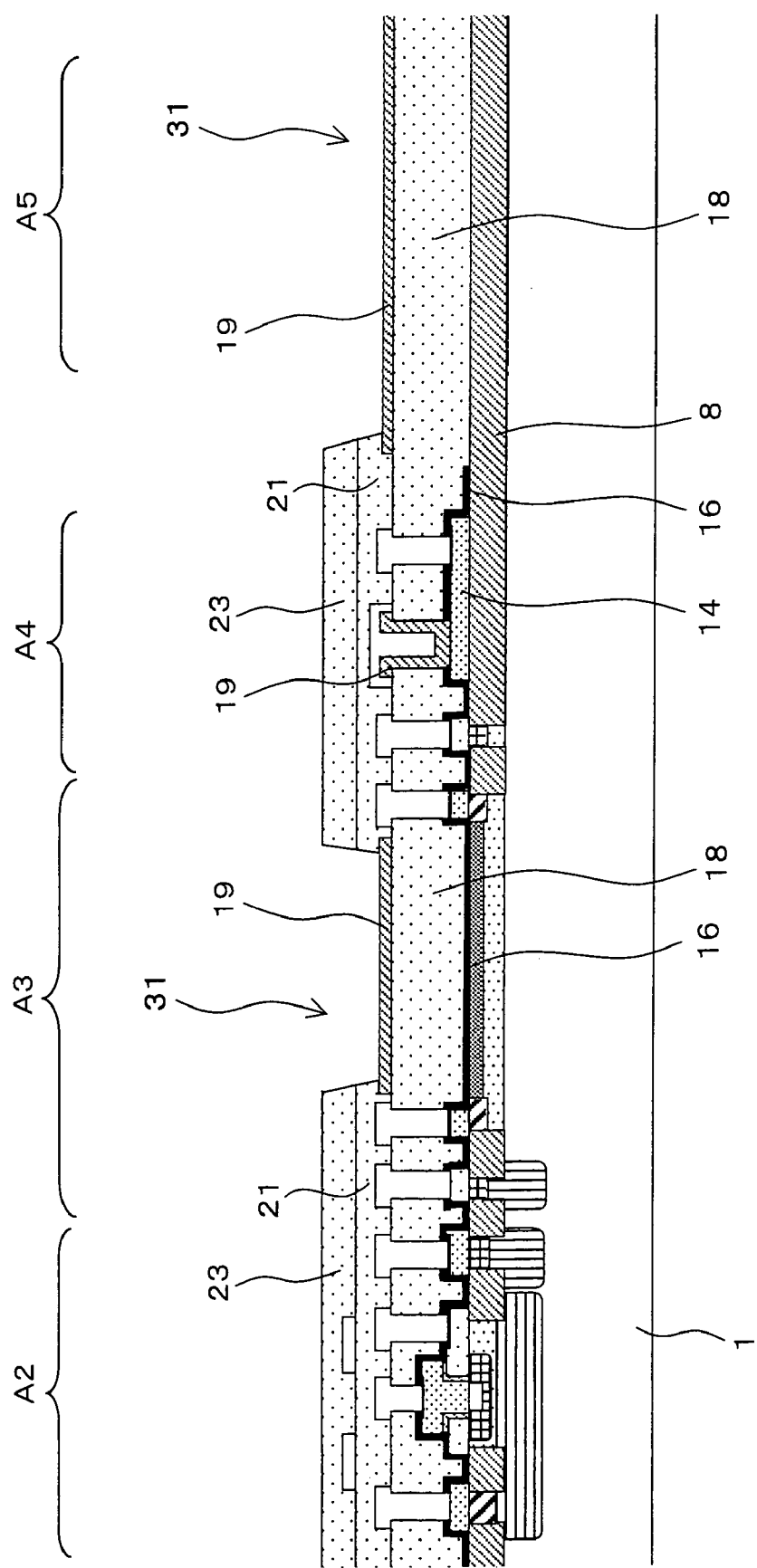
FIG. 6 is a cross sectional diagram illustrating the steps up to the removal of the portions of the second insulating film and the third insulating film above the photo detector and the micromirror so as to expose the etching stopping film in accordance with the above described manufacturing method.

(6) Next, as shown in FIG. 6, first openings 31 are created in the third insulating film 23 and the second insulating film 21 made of plasma TEOS films according to a photo etching technology in the region where photo detectors are formed A3 and the region where micromirrors are formed A5, so as to expose the surface of the etching stopping film 19 made of a silicon nitride film. In the above described etching process, the etching stopping film 19 is not etched, due to the selective ratio thereof, and etching stops at the surface of the etching stopping film 19.

Figure 7:
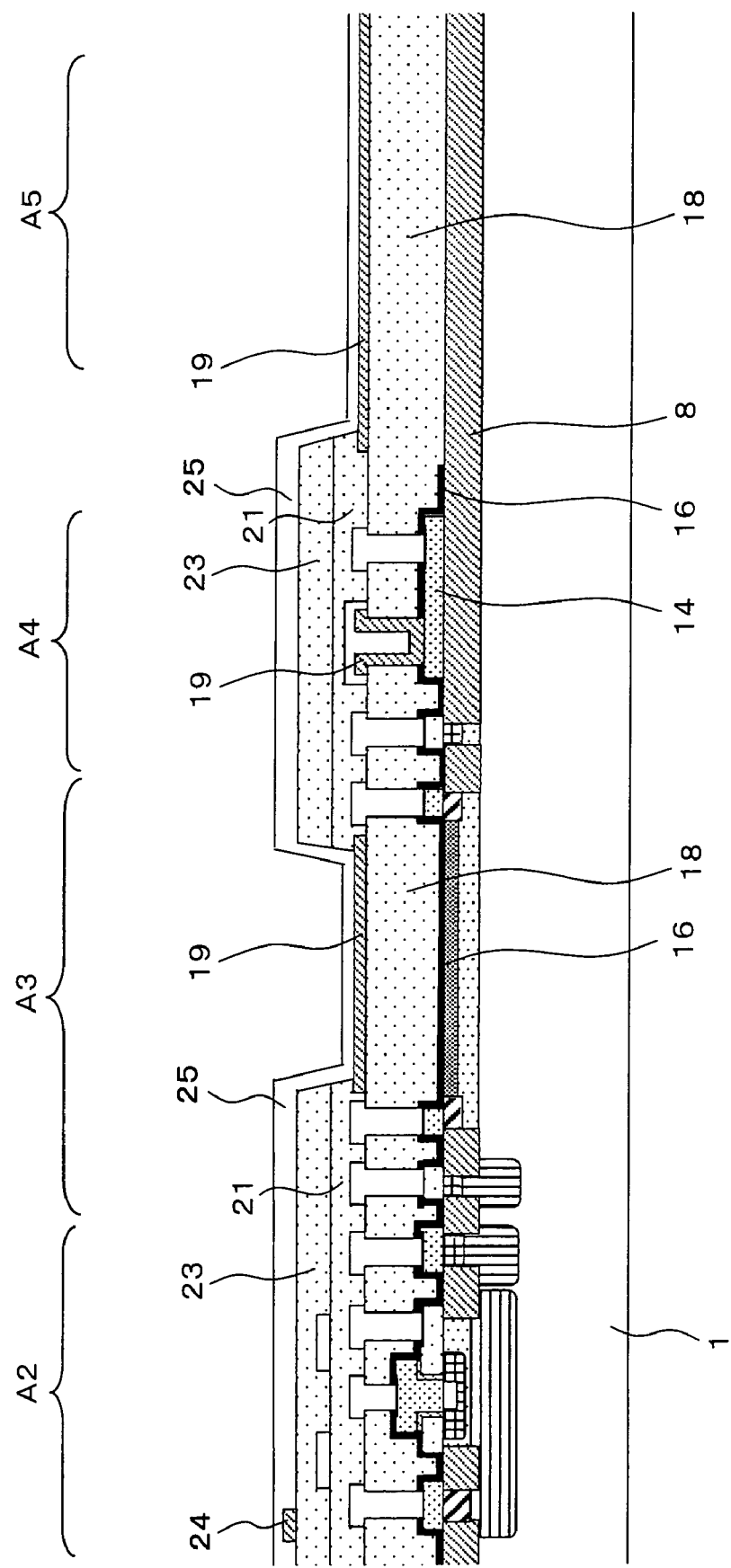
FIG. 7 is a cross sectional diagram illustrating the steps up to the formation of a first protective film in accordance with the above described manufacturing method.

(7) Next, as shown in FIG. 7, a third wire layer 24 is formed on the third insulating film 23, and a first protective film 25 is formed of a silicon nitride film on the third wire layer 24 and the etching stopping film 19.

Figure 8:
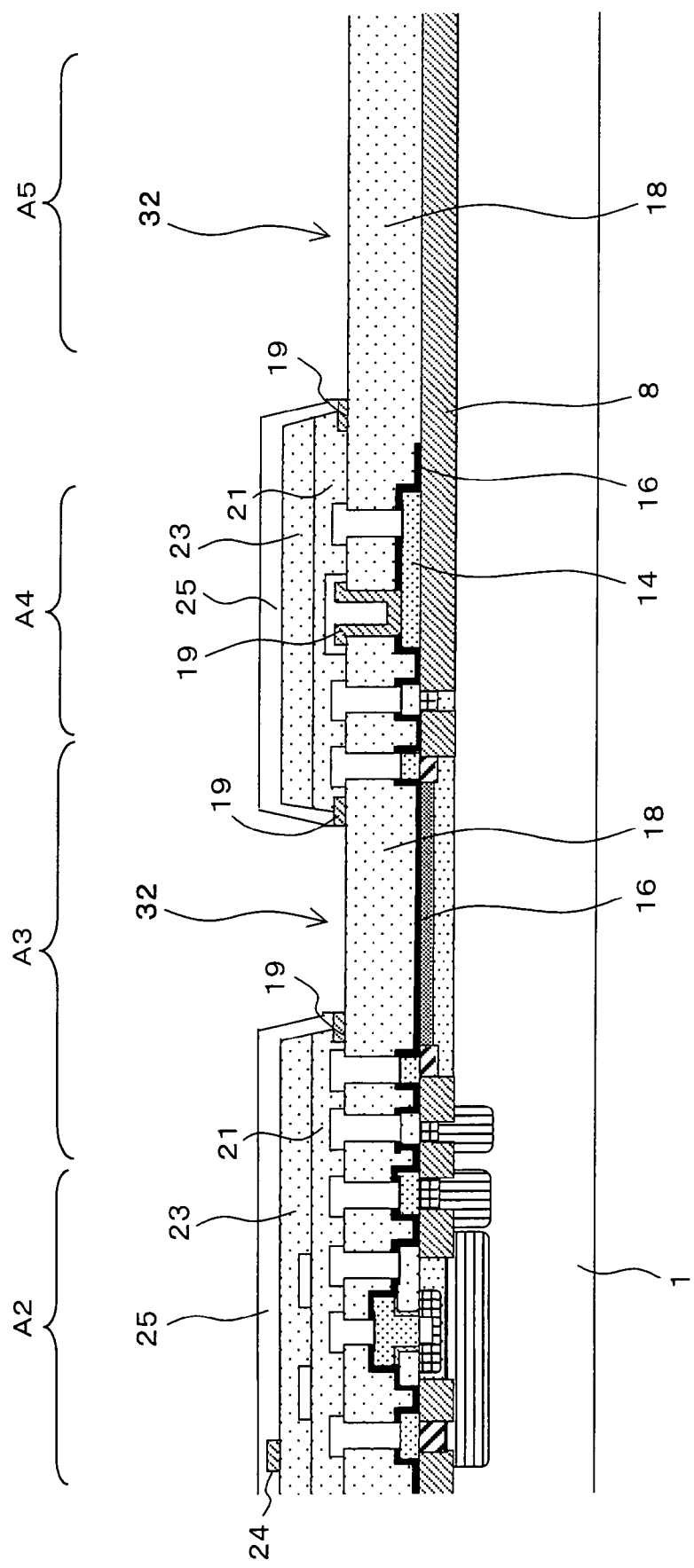
FIG. 8 is a cross sectional diagram illustrating the steps up to the removal of the portions of the first protective film and the etching stepping film above the photo detector and the micromirror after the formation of the first protective film in accordance with the above described manufacturing method.

(8) Next, as shown in FIG. 8, second openings 32 are created by etching portions of the etching stopping film 19 and the first protective film 25 on the first insulating film 18 in the region where photo detectors are formed A3 and the region where micromirrors are formed A5. According to the present embodiment, the etching stopping film 19 and the first protective film 25 are both made of silicon nitride films, and therefore, openings can be created at the same time. Here, even in the case where the first protective film 25 is formed of an insulating film, for example, a silicon oxide nitride film, that is different from that of the etching stopping film 19, openings can be created at the same time, by selecting appropriate etching conditions.

Figure 9:
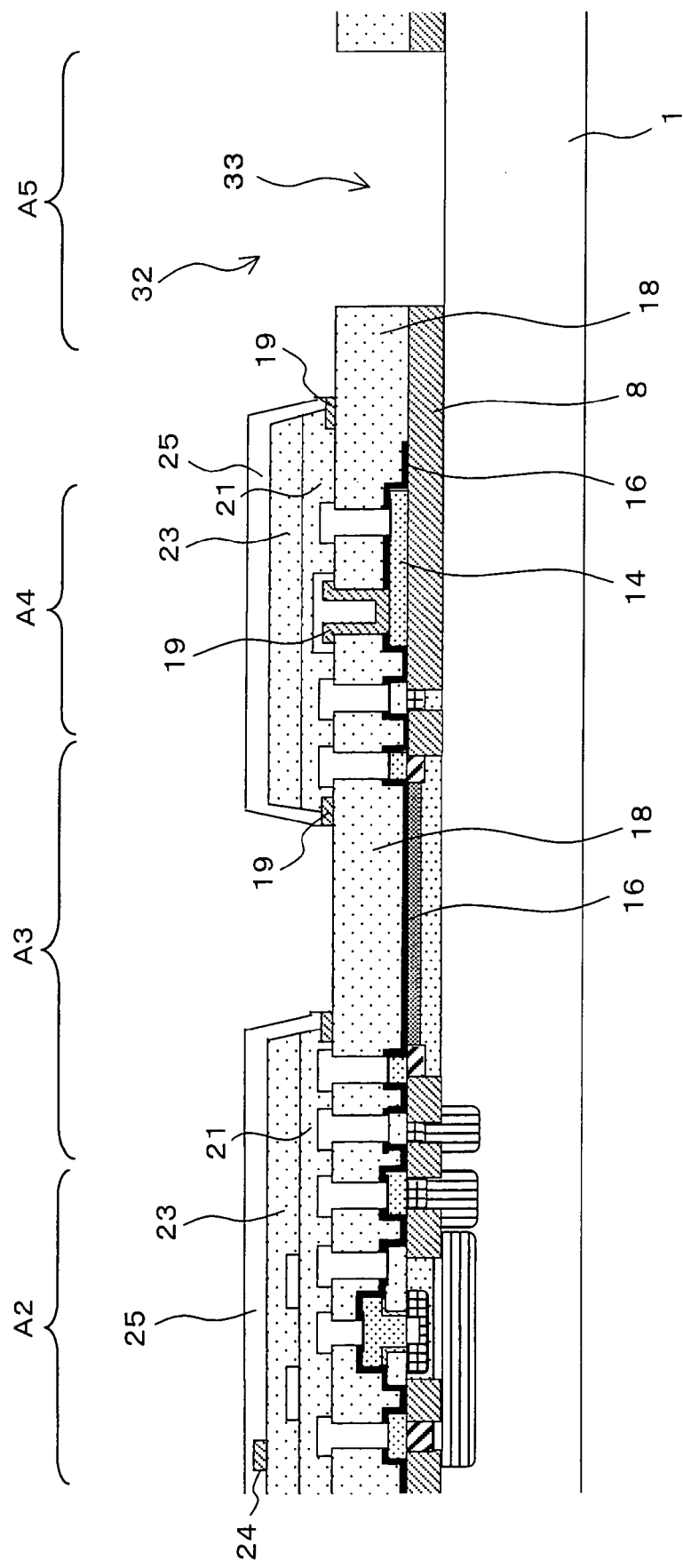
FIG. 9 is a cross sectional diagram illustrating the steps up to the creation of an opening in the first insulating film and the insulating film for isolation in the region where micromirrors are formed in accordance with the above described manufacturing method.

(9) Next, as shown in FIG. 9, a third opening 33 is created by etching a portion of the first insulating film 18 and the insulating film for isolation 8 within a second opening 32 in the region where micromirrors are formed A5. This etching stops at the surface of the semiconductor substrate 1.

Figure 10:
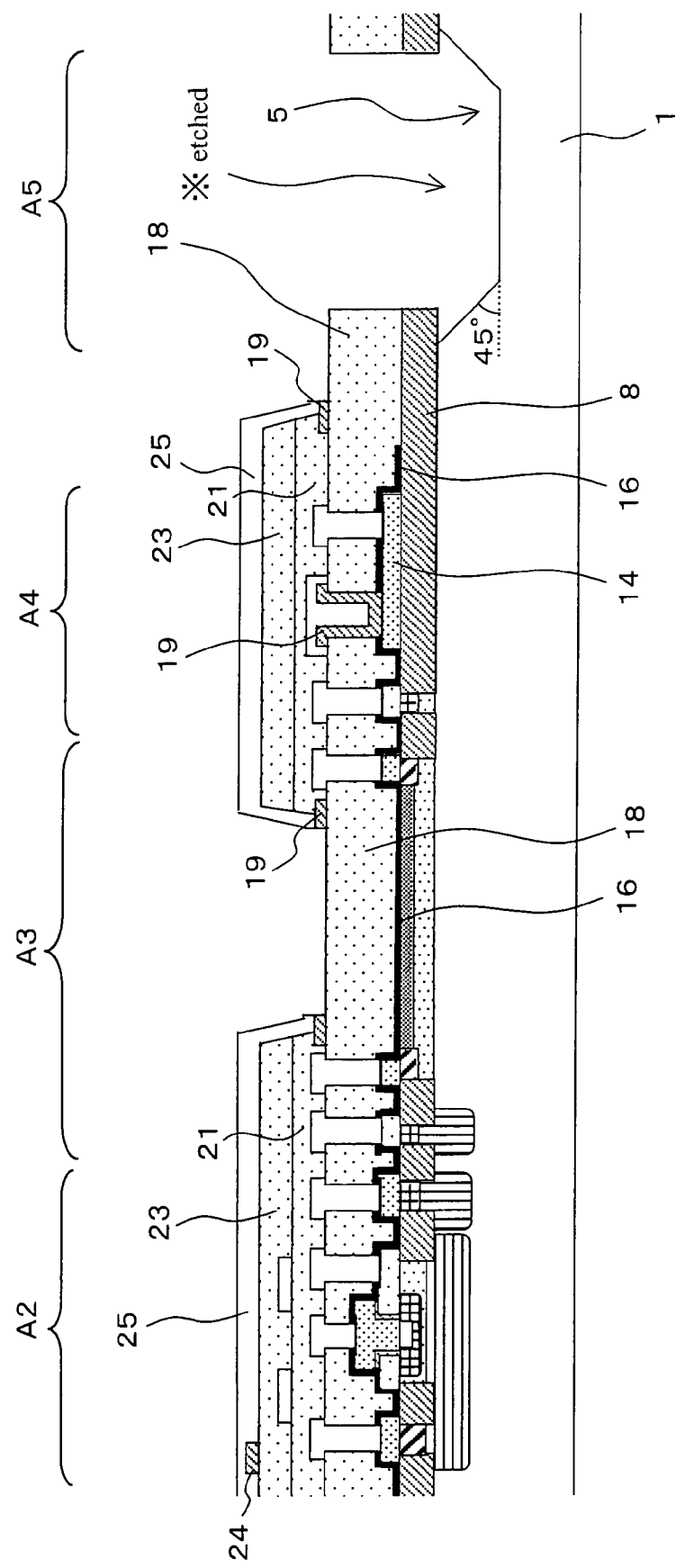
FIG. 10 is a cross sectional diagram illustrating the steps up to the formation of a micromirror using a potassium hydroxide solution in accordance with the above described manufacturing method.

(10) Next, as shown in FIG. 10, the semiconductor substrate 1 is etched in the third opening 33 with a potassium hydroxide solution, using the first insulating film 18 made of BPSG and the insulating film for isolation 8 as a mask, and thereby, a micromirror 5 having an angle of 45° relative to the surface of the substrate is formed. Resist masks are etched in a potassium hydroxide solution during an etching process using this solution. Therefore, the micromirror 5 is formed by using the first insulating film 18 made of BPSG and the insulating film for isolation 8 as a mask. In the above described etching process, the etching stopping film 19 made of a silicon nitride film in the region where photo detectors are formed A3 and the region where micromirrors are formed A5 is not etched by the potassium hydroxide solution. That is to say, the etching stopping film 19 is not corroded.

Figure 11:
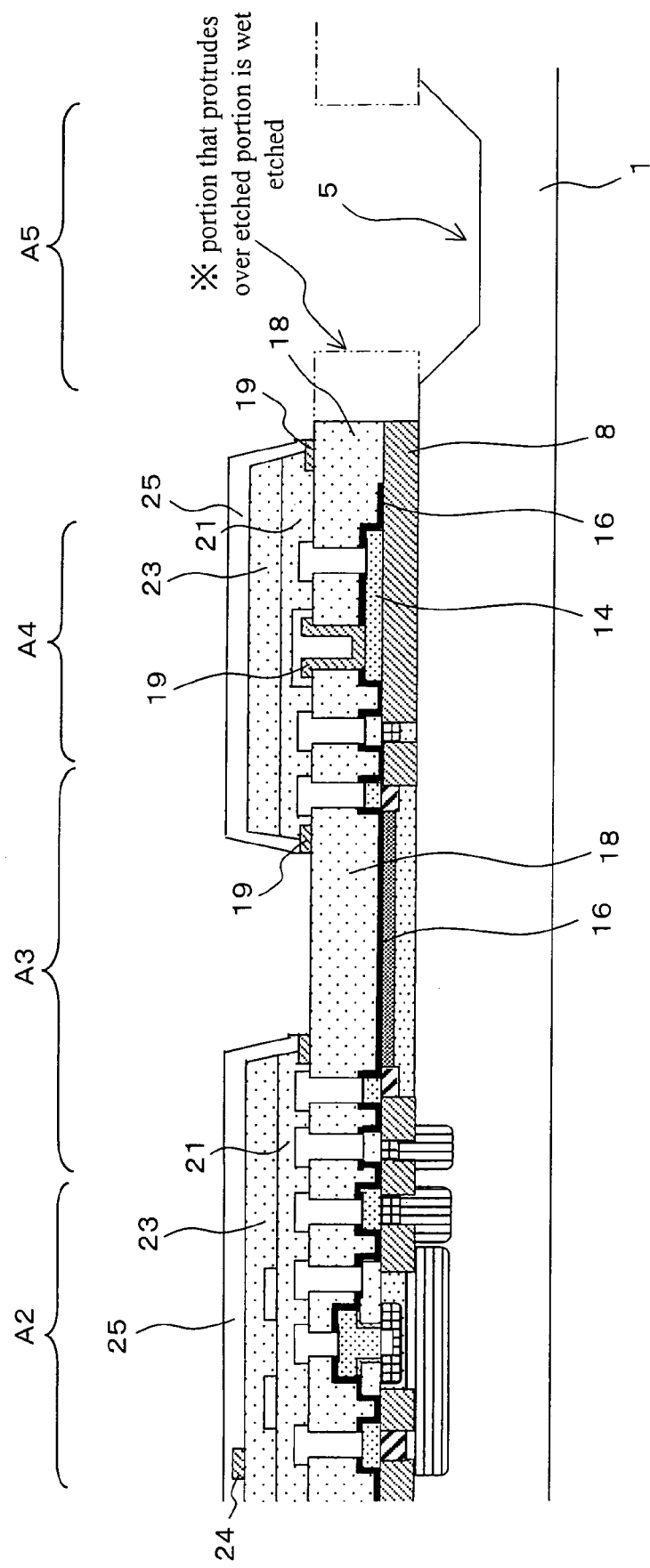
FIG. 11 is a cross sectional diagram illustrating the steps up to the removal of the portion of the first insulating film and the insulating film for isolation that protrudes over the etched portion and that has been created at the time of the formation of the micromirror in accordance with the above described manufacturing method.

(11) Next, as shown in FIG. 11, the portion of the first insulating film 18 and the insulating film for isolation 8 which protrudes over the etched portion and is created at the time of the formation of micromirror 5 is removed through wet etching, using a fluoric acid solution. In the case where the portion that protrudes over the etched portion is removed by means of dry etching, the micromirror 5 is deformed. Therefore, wet etching is used to remove the protruding portion.

Figure 12:
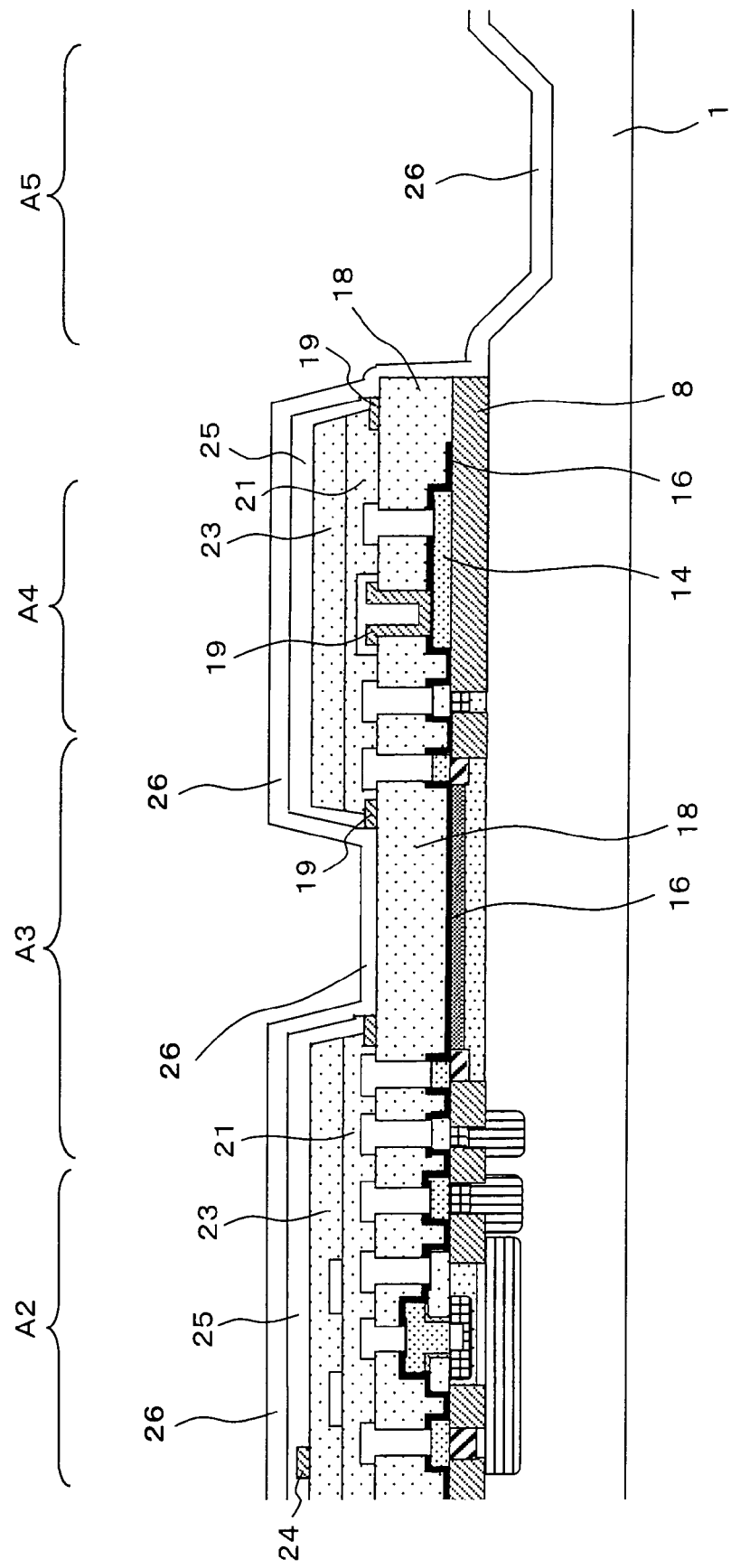
FIG. 12 is a cross sectional diagram illustrating the steps up to the formation of a second protective film in accordance with the above described manufacturing method.

(12) Next, as shown in FIG. 12, a second protective film 26 is formed on the first protective film 25, as well as the exposed first insulating film 18 and semiconductor substrate 1, according to a CVD method. According to the present embodiment, a silicon nitride film that is the same as that of the first protective film 25 is used for the second protective film 26. Here, other insulating films, such as silicon oxide nitride films, may be used.

Figure 13:
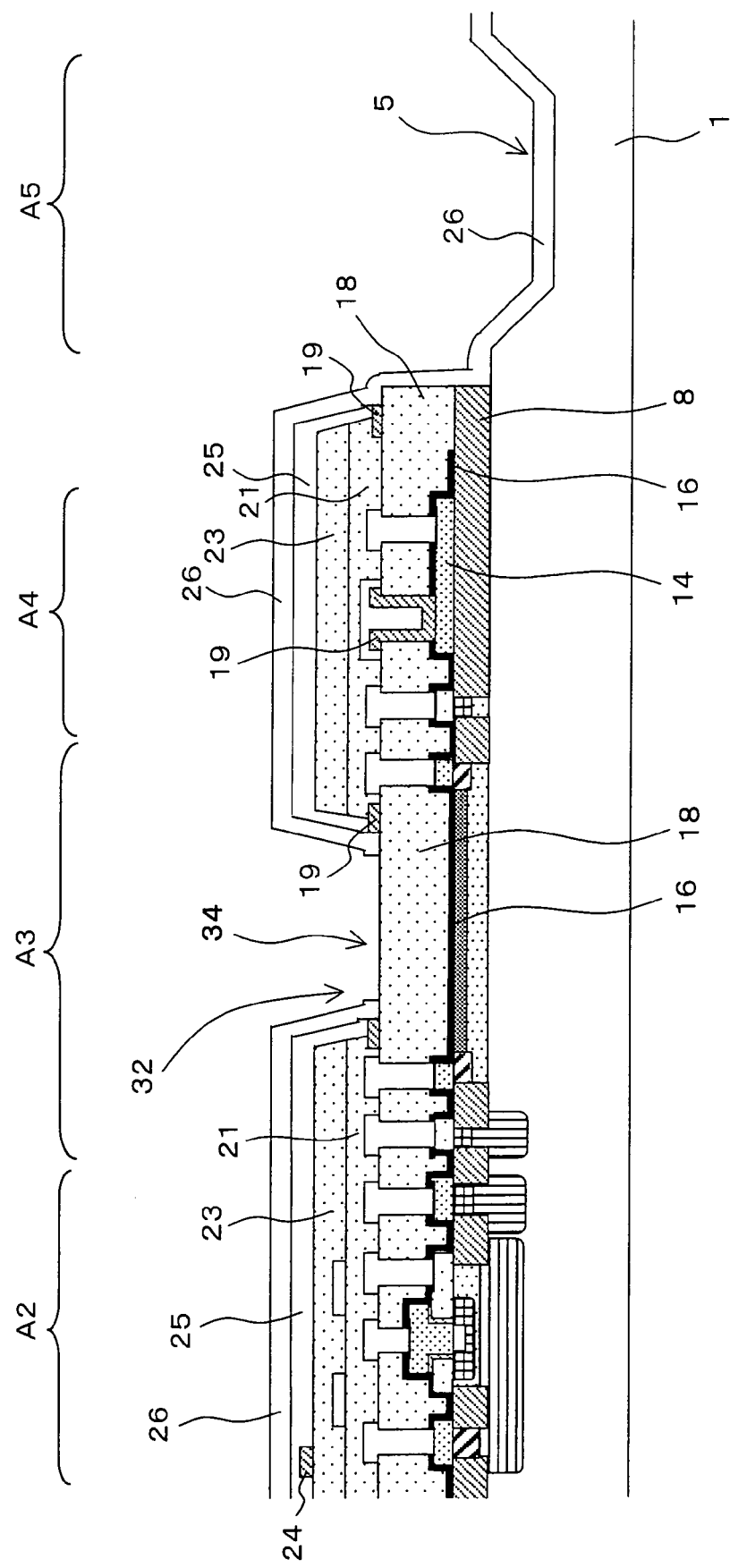
FIG. 13 is a cross sectional diagram illustrating the steps up to the state where the second protective film on the photo detector has been etched in accordance with the above described manufacturing method.

(13) Next, as shown in FIG. 13, a fourth opening 34 is created by etching the second protective film 26 within a second opening 32 in the region where photo detectors are formed A3. This etching stops at the surface of the first insulating film 18.

(14) Next, as shown in FIG. 14, a portion of the first insulating film (PSG film) 18 on the antireflection film (silicon nitride film) 16 is removed through etching in the region where photo detectors are formed A3. During this etching process, the antireflection film 16 is not etched, due to the selective ratio thereof, and the etching stops at the surface of the antireflection film 16, and thereby, the antireflection film 16, of which the film thickness has been controlled to a desired thickness, can be formed.

Here, though according to the present embodiment, a silicon nitride film is used for the antireflection film, a silicon oxide nitride film, a silicon carbide film and the like may be used as deposition films, in addition to this.

The etching stopping film 19 is formed according to the above described manufacturing method, and thereby, the antireflection film 16 can be formed without reducing the thickness of the film in the region where photo detectors are formed A3, and therefore, the photoelectric conversion efficiency of the photo detector 3 can be greatly improved.

In addition, the etching stopping film 19 is formed in the region where micromirrors are formed A5, and thereby, the region where photo detectors are formed A3 and the micromirror 5 can be formed while keeping low the amount of side etching, as a result of wet etching, in a manner where dispersion in the form can be reduced.

Furthermore, a silicon nitride film which cannot be etched by alkaline or acid is used for the etching stopping film 19, and thereby, the micromirror 5 can be formed without making the etching stopping film corrode at the time of etching for the formation of the micromirror.

In addition, as shown in FIG. 14, the etching stopping film 19 that has been left on the edge portion of the photo detector 3 works as a reflective film, suppressing the effects of light around the periphery of the end portion of the photo detector 3, and thus, the sensitivity and the speed of response of the photo detector 3 are increased.

FIG. 15 shows the completed state.

In the region where transistors are formed A2, the first insulating film 18 made of a BPSG film for isolation between elements and isolation between electrodes, the second insulating film 21 and the third insulating film 23 made of plasma TEOS films, as well as the first protective film 25 and the second protective film 26 made of silicon nitride films are sequentially layered on the basis structure of the transistor 2 of a bipolar type.

In the region where photo detectors are formed A3, the antireflection film 16 is formed of a silicon nitride film on the anode region 1 made of the P type semiconductor substrate 1, as well as cathode regions 17 and 15, so that the photo detector 3 is formed.

In the region where capacitors are formed A4, the first insulating film 18 made of a BPSG film for isolation between elements and for isolation between electrodes is formed on the capacitor 4 that is formed of the polysilicon electrode (lower electrode) 14 on the insulating film for isolation 8, the capacitor insulating film 19 that is used also as the etching stopping film, and the aluminum electrode (upper electrode) 20, and furthermore, the second insulating film 21 and the third insulating film 23 made of plasma TEOS films, as well as the first protective film 25 and the second protective film 26 made of silicon nitride films, are sequentially layered.

In the region where micromirrors are formed A5, the second protective film 26 made of a silicon nitride film is formed on a mirror surface that has an angle of 45° relative to the surface of the substrate within a recess of the semiconductor substrate 1, so that the micromirror 5 is formed.

The present invention is not limited only to the above described embodiments, but rather, it is possible to implement the invention with a variety of modifications, within the scope of its technological concept.

As described in detail above, according to the present invention, the insulating film on the antireflection film and the etching stopping film on top of this insulating film work together, so that corrosion of the etching stopping film can be avoided at the time of the formation of a micromirror by etching a portion of the substrate in the region where micromirrors are formed, and at the same time, the film thickness of the antireflection film can be controlled with high precision, and an increase in the sensitivity of the photo detector can be achieved.

In addition, as a result of the formation of the etching stopping film, the insulating film that has been left in the region where photo detectors are formed and the region where micromirrors are formed can be made more controllable, and dispersion in the form of the photo detector and the micromirror can be reduced.

In addition, the etching stopping film that has been provided in the periphery around the edge of the photo detector works also as a reflective film, suppressing the effects of light around the periphery of the edge of the photo detector, so that the sensitivity and the speed of response of the photo detector can be improved.

An optical semiconductor device according to the present invention has an integrated circuit, a photo detector and a micromirror on the same substrate, and therefore, is useful as an optical pickup part for a DVD or a CD.

What is claimed is:

1. A manufacturing method for an optical semiconductor device where an integrated circuit, a photo detector and a micromirror are integrated on a mono-substrate, comprising:
    a step of forming an antireflection film on the photo detector;
    a step of forming an insulating film on the antireflection film;
    a step of forming an etching stopping film on the insulating film;
    a step of forming an interlayer insulating film on the etching stopping film; and
    a step of creating first openings in the interlayer insulating film above the photo detector and above a micromirror region where the micromirror is to be formed such that the etching stopping film is exposed,
    wherein in the step of creating first openings, the etching stopping film in the first openings remains unetched.

2. The manufacturing method for an optical semiconductor device as claimed in claim 1, further comprising:
    a step of removing the etching stopping film through etching before the step of forming the interlayer insulating film so as to leave the etching stopping film above the photo detector and above the micromirror region;
    a step of forming a first protective film after the step of creating the first openings on the interlayer insulating film and on the etching stopping film that has been exposed; and
    a step of creating second openings above the photo detector and above the micromirror region in the first protective film and the etching stopping film within the first openings.

3. The manufacturing method for an optical semiconductor device as claimed in claim 2, wherein the etching stopping film is left around a periphery of the second openings in the step of creating the second openings.

4. The manufacturing method for an optical semiconductor device as claimed in claim 2, further comprising:
    a step of creating a third opening in the insulating film within the second opening above the micromirror region;
    a step of forming the micromirror by etching the mono-substrate within the third opening;
    a step of forming a second protective film on the portion of the mono-substrate where the micromirror is formed;

a step of creating a fourth opening in the second protective film within the second opening above the photo detector; and a step of etching the insulating film within the fourth opening so as to expose the antireflection film.

5. The manufacturing method for an optical semiconductor device as claimed in claim 1, wherein the antireflection film and the etching stopping film are formed of silicon nitride films, and the insulating film is formed of a BPSG film.

6. The manufacturing method for an optical semiconductor device as claimed in claim 2, wherein the antireflection film and the etching stopping film are formed of silicon nitride films, and the insulating film is formed of a BPSG film.

7. The manufacturing method for an optical semiconductor device as claimed in claim 1, wherein a capacitor is formed on the same mono-substrate, where the etching stopping film is used also as a capacitor insulating film.

8. The manufacturing method for an optical semiconductor device as claimed in claim 2, wherein a capacitor is formed on the same mono-substrate, where the etching stopping film is used also as a capacitor insulating film.

9. The manufacturing method for an optical semiconductor device as claimed in claim 3, wherein the etching stopping film left around the periphery of the second opening above the photo detector is used as a reflective film for light that enters through an edge of the photo detector.

\* \* \* \* \*